United States Patent
Estrada et al.

(10) Patent No.: US 9,007,500 B2
(45) Date of Patent: Apr. 14, 2015

(54) PROGRAMMABLE GLOBAL SHUTTER TIMING TO MITIGATE TRANSIENT GLITCHING

(71) Applicants: David Estrada, Pasadena, CA (US); Sam Bagwell, Pasadena, CA (US); Loc Truong, Pasadena, CA (US)

(72) Inventors: David Estrada, Pasadena, CA (US); Sam Bagwell, Pasadena, CA (US); Loc Truong, Pasadena, CA (US)

(73) Assignee: Forza Silicon Corporation, Pasadena, CA (US)

( * ) Notice: Subject to any disclaimer, the term of this patent is extended or adjusted under 35 U.S.C. 154(b) by 79 days.

(21) Appl. No.: 13/950,080

(22) Filed: Jul. 24, 2013

(65) Prior Publication Data

US 2014/0061435 A1    Mar. 6, 2014

Related U.S. Application Data

(60) Provisional application No. 61/675,230, filed on Jul. 24, 2012.

(51) Int. Cl.
| | | |
|---|---|---|
| H04N 3/14 | (2006.01) | |
| H04N 5/335 | (2011.01) | |
| H04N 5/376 | (2011.01) | |
| H03K 5/14 | (2014.01) | |
| H04N 5/353 | (2011.01) | |

(52) U.S. Cl.
CPC ............... *H04N 5/3765* (2013.01); *H03K 5/14* (2013.01); *H04N 5/353* (2013.01)

(58) Field of Classification Search
None
See application file for complete search history.

(56) References Cited

U.S. PATENT DOCUMENTS

| | | | |
|---|---|---|---|
| 2005/0057380 A1* | 3/2005 | Na ................................ | 341/123 |
| 2010/0245647 A1* | 9/2010 | Honda et al. .................. | 348/308 |

* cited by examiner

*Primary Examiner* — Justin P Misleh
(74) *Attorney, Agent, or Firm* — Law Office of Scott C. Harris, Inc.

(57) ABSTRACT

An image sensor system using a circuit that automatically provides a multiple point output which represents, in a first mode, each of the multiple points receiving outputs at substantially the same time delayed only by a transit time across a wire connecting the multiple point outputs, and in a second mode, each of the multiple points producing outputs that are delayed by a delay time, where each output is delayed relative to each other output by said delay time in the second mode.

17 Claims, 2 Drawing Sheets

PROGRAMMABLE GLOBAL SHUTTER TIMING TO MITIGATE TRANSIENT GLITCHING

This application claims priority from Provisional application No. 61,675,230, filed Jul. 24, 2012, the entire contents of which are herewith incorporated by reference.

BACKGROUND

Image sensors with a global shutter style frame timer are designed such that pixel integration happens simultaneously for all pixels in the array. In this case, the operations associated with the beginning and end of pixel integration happen essentially simultaneously for all pixels. The operations associated with the beginning of integration (e.g., the reset operation) and with the ending of integration (snapshot operation) can have transient effects on pixel references and power supplies of both the pixel and row driver. Depending on the specific pixel design and array size, these transient demands may be severe enough that they may cause image artifacts or collapse a supply or reference altogether.

Moreover, even with basic metal signal routing, the global shutter operation does not happen for all pixels truly simultaneously. The routing induces a small time-of-flight delay such that the operations on the row closest to the signal driver will happen before those on the row furthest from the signal driver. This delay can help mitigate the previously mentioned transient demands. The time-of-flight delay, however, may be insufficient, in which case it may be desirable to insert additional row-to-row delay. Increasing the delay, however, decreases the 'global' nature of the shutter.

There is an optimization to find the minimum row-to-row delay that effectively will spread out transient demands on the power supplies and references to the point there are no artifacts.

Different pixel modes of operation and frame size (in the case of windowing, for example), may change the transient demands on the power supplies. There may also be some desire to trade-off minimal image artifacts for a 'faster' global shutter. Additionally, the array artifacts are difficult and time intensive to model and simulate.

SUMMARY

The inventors recognized that due to these various considerations, it is desirable to have an adjustable row-to-row delay for the global frame shutter controls.

Embodiments describe an approach for programmable propagation delays for shutter timing control signals in global shutter image sensors.

DETAILED DESCRIPTION

Figure 1:
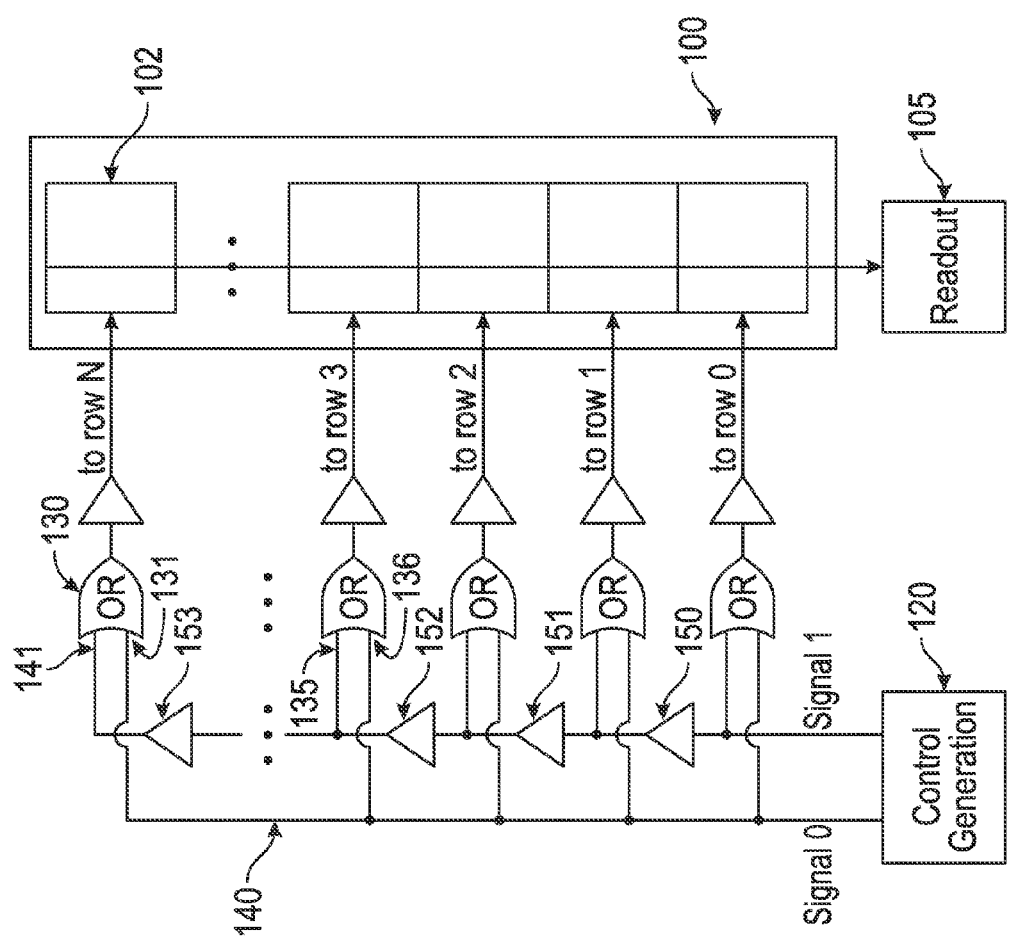
FIG. 1 shows a block diagram.
Figure 2:
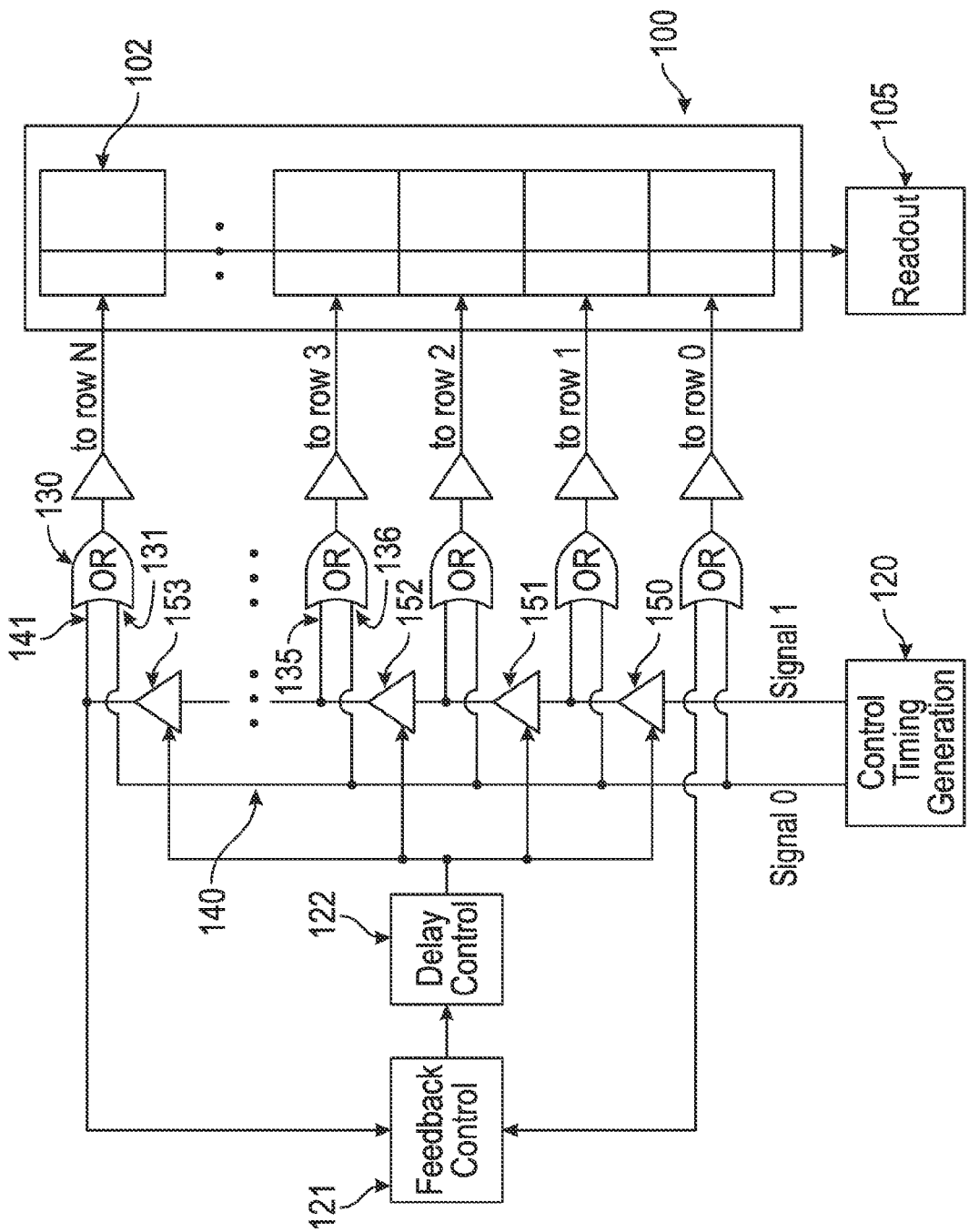
FIG. 2 shows an alternative with feedback.

Embodiments describe an implementation of an adjustable row-to-row delay for global shutter control signals in a CMOS image sensor array. The CMOS image sensor array as shown generally is 100, as including a plurality of pixels such as 102, arranged into rows and columns. FIG. 1 illustrates a column parallel arrangement, where the rows are commonly read out by a readout circuit 105 to produce an output of the array. A control circuit 120, which can be a processor or dedicated circuitry for carrying out the control that produces output signals that control the array.

The control device also produces outputs that control the global shutter operation.

For each global shutter control signal, every row such as row N has a two input OR gate 130. One input 131 of the OR gate 130 is connected to receive directly the control signal 140 such that the first input of all the different or gates are connected to the control signal in parallel. For example, the second Or gate 135 has a first input 136 that also receives the same control signal 140. For all the paths that receive this signal, the propagation delay across the rows is purely the time-of-flight delay of the signal 140.

The second input 141 of the OR gate 130 is connected to a tap of a daisy chain of delay elements 150, 151, 152, 153. While these are shown as separate delay elements, it should be understood that these could also be separate taps off a single delay line element. These delay elements set the row-to-row delay.

The inputs to either path are separately controlled. In the case where the smallest possible delay is desired, the parallel control input 140 is toggled and the daisy chain input is gated low. In the case where a row-to-row delay is required, the daisy chain input is toggled and the parallel control input is gated low.

The delay element 150 itself is a small current-limited buffer cell. The current limiters are controlled with an on-chip current DAC. By adjusting the current DAC, the current limiting can be adjusted (or turned off), which effectively adjusts the delay of the buffer cells, and thus the propagation delay of signals across the array.

Additionally, rising edge and falling edge delays through the daisy chained delay elements can be adjusted separately according to the specific control signal. For some signals (e.g. pixel reset), the rising edge has particularly severe transient effects on the power supply while the falling edge is the timing critical signal, but does not have a large effect on the power supply. In this case, the delay for the rising edge of the signal is made large to mitigate the power supply effects, while the falling edge has a much smaller delay to maintain global shutter performance.

In cases where it is critical to have a known and fixed absolute delay, an embodiment a feedback circuit 121 that monitors the end-to-end delay of the daisy chain (151, 152, 153 . . . ), then adjusts the timing of the individual delay element delays to achieve and maintain the desired end-to-end delay. This feedback circuit ensures that the delay is constant as power supply, temperature, and process parameters vary. For example, the feedback circuit can be formed of a processor or controller that carries out these functions.

Other embodiments include additional functionality in the feedback circuits that monitor other sensor performance metrics, either analog or digital, and adjust the delays automatically to ensure constant device performance.

Although only a few embodiments have been disclosed in detail above, other embodiments are possible and the inventors intend these to be encompassed within this specification. The specification describes specific examples to accomplish a more general goal that may be accomplished in another way. This disclosure is intended to be exemplary, and the claims are intended to cover any modification or alternative which might be predictable to a person having ordinary skill in the art. For example, other numbers of readout circuits could be used and other kinds of delays could be used. Also, while the gates are as "or" gates, they could also be other kinds of gates that can automatically switch or could switch based on a wired or wireless command.

Those of skill would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary embodiments.

The various illustrative logical blocks, modules, and circuits described in connection with the embodiments disclosed herein, may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. The processor can be part of a computer system that also has a user interface port that communicates with a user interface, and which receives commands entered by a user, has at least one memory (e.g., hard drive or other comparable storage, and random access memory) that stores electronic information including a program that operates under control of the processor and with communication via the user interface port, and a video output that produces its output via any kind of video output format, e.g., VGA, DVI, HDMI, displayport, or any other form. This may include laptop or desktop computers, and may also include portable computers, including cell phones, tablets such as the IPAD™, and all other kinds of computers and computing platforms.

A processor can be used to control the operation, or alternatively the operation can be controlled by a controller. The processor may be implemented as a combination of computing devices, e.g., a combination of a DSP and a microprocessor, a plurality of microprocessors, one or more microprocessors in conjunction with a DSP core, or any other such configuration. These devices may also be used to select values for devices as described herein.

The steps of a method or algorithm described in connection with the embodiments disclosed herein may be embodied directly in hardware, in a software module executed by a processor, using cloud computing, or in combinations. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of tangible storage medium that stores tangible, non transitory computer based instructions. An exemplary storage medium is coupled to the processor such that the processor can read information from, and write information to, the storage medium. In the alternative, the storage medium may be integral to the processor. The processor and the storage medium may reside in reconfigurable logic of any type.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer.

The memory storage can also be rotating magnetic hard disk drives, optical disk drives, or flash memory based storage drives or other such solid state, magnetic, or optical storage devices. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media. The computer readable media can be an article comprising a machine-readable non-transitory tangible medium embodying information indicative of instructions that when performed by one or more machines result in computer implemented operations comprising the actions described throughout this specification.

Also, the inventor(s) intend that only those claims which use the words "means for" are intended to be interpreted under 35 USC 112, sixth paragraph. Moreover, no limitations from the specification are intended to be read into any claims, unless those limitations are expressly included in the claims. The computers described herein may be any kind of computer, either general purpose, or some specific purpose computer such as a workstation. The programs may be written in C, or Java, Brew or any other programming language. The programs may be resident on a storage medium, e.g., magnetic or optical, e.g. the computer hard drive, a removable disk or media such as a memory stick or SD media, or other removable medium. The programs may also be run over a network, for example, with a server or other machine sending signals to the local machine, which allows the local machine to carry out the operations described herein.

Where a specific numerical value is mentioned herein, it should be considered that the value may be increased or decreased by 20%, while still staying within the teachings of the present application, unless some different range is specifically mentioned. Where a specified logical sense is used, the opposite logical sense is also intended to be encompassed.

The previous description of the disclosed exemplary embodiments is provided to enable any person skilled in the art to make or use the present invention. Various modifications to these exemplary embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. A system comprising:
    a circuit comprising a plurality of outputs; and
    an image sensor device receiving the plurality of outputs at a plurality of inputs,
    where,
    in a first mode, each of the plurality of outputs outputs a signal to the plurality of inputs at substantially a same time delayed only by a transit time across a wire connecting the plurality of outputs, and
    in a second mode, each of the plurality of outputs outputs the signal to the plurality of inputs after being delayed by a delay time, where each output is delayed relative to each other output by said delay time in said second mode.

2. The system as in claim 1, wherein said circuit includes delay lines with plural different taps, each tap producing one of the outputs that is delayed in said second mode.

3. The system as in claim 2, wherein said delay lines are programmable to produce outputs that are delayed relative to one another via a programmable amount.

4. The system as in claim 3, wherein propagation delays of rising and falling edges of signals are separately programmable.

5. The system in claim 3, where the delay lines are programmable via an analog current limiting structure.

6. The system in claim 3, further comprising a feedback circuit that measures an overall end-to-end delay of the system and automatically adjusts individual elements of the delay lines to achieve and maintain a specified end-to-end delay.

7. The system in claim 2, wherein the delay lines have delay elements, and each of said delay elements has a separately programmable delay.

8. The system in claim 2, wherein the delay lines have delay elements, and each of said delay elements and where both a rising and a falling edge delay of each said delay element has a separately programmable delay.

9. The system as in claim 1, wherein said plurality of inputs of said image sensor device are used for operating the image sensor device.

10. The system in claim 7, further comprising a feedback circuit that automatically adjusts delays of the delay elements according to measured analog or digital metrics in the image sensor device to achieve and maintain desired performance of the image sensor device.

11. A method comprising:
    operating an image sensor to obtain pixels of an image, said image sensor having a plurality of inputs receiving drive signals;
    where said operating comprises, using a circuit for producing multiple outputs for driving said plurality of inputs, said operating comprising first driving in a first mode, by driving each of multiple outputs at substantially a same time delayed only by a transit time across a wire connecting the multiple outputs, and second driving in a second mode, by delaying the driving of each of said multiple outputs by a delay time, where each output is delayed relative to each other output by said delay time in said second mode.

12. The method as in claim 11, further comprising changing a delay of said multiple outputs using a programmable feature to produce outputs that are delayed relative to one another via a programmable amount.

13. The method as in claim 12, further comprising changing propagation delays of rising and falling edges of signals, where said propagation delays are separately programmable from said delay.

14. The method in claim 12, where the programmable feature is achieved via an analog current limiting structure.

15. The method in claim 12, further comprising using a feedback circuit to measure an overall end-to-end delay and automatically adjust individual delays to achieve and maintain a specified end-to-end delay.

16. The method in claim 12, wherein the delay is created by multiple delay elements in a daisy chain, each of which has a separately programmable delay.

17. The method in claim 16, wherein both a rising and falling edge delay of each element in the daisy chain has a separately programmable delay.

* * * * *